United States Patent
Nanri et al.

(10) Patent No.: US 8,933,423 B2
(45) Date of Patent: Jan. 13, 2015

(54) CHARGED PARTICLE BEAM DEVICE AND SAMPLE PRODUCTION METHOD

(75) Inventors: Terutaka Nanri, Tokyo (JP); Satoshi Tomimatsu, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/119,807

(22) PCT Filed: May 16, 2012

(86) PCT No.: PCT/JP2012/062469
§ 371 (c)(1),
(2), (4) Date: Nov. 22, 2013

(87) PCT Pub. No.: WO2012/169323
PCT Pub. Date: Dec. 13, 2012

(65) Prior Publication Data
US 2014/0076717 A1 Mar. 20, 2014

(30) Foreign Application Priority Data

Jun. 6, 2011 (JP) ................................ 2011-126235

(51) Int. Cl.
*G21K 5/04* (2006.01)
*H01J 37/305* (2006.01)
*H01J 37/244* (2006.01)
(Continued)

(52) U.S. Cl.
CPC ........... *H01J 37/3056* (2013.01); *H01J 37/244* (2013.01); *H01J 37/30* (2013.01); *H01J 37/304* (2013.01); *H01J 2237/31713* (2013.01); *H01J 2237/31745* (2013.01)

USPC ................. 250/492.1; 250/492.2; 250/492.3; 250/396 R; 250/397

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS 6,288,393 B1 9/2001 Phaneuf et al.
7,069,155 B1 6/2006 Phan et al.
(Continued)

FOREIGN PATENT DOCUMENTS

CN 1735866 A 2/2006
DE 11 2005 000 660 T5 2/2007
(Continued)

OTHER PUBLICATIONS

International Search Report issued in International Application No. PCT/JP2012/062469 dated Jun. 12, 2012.
(Continued)

*Primary Examiner* — Nicole Ippolito
(74) *Attorney, Agent, or Firm* — McDermott Will & Emery LLP

(57) ABSTRACT

Provided is a technique to perform FIB milling, in spite of its sample dependency, effectively into a desired shape without influences of individual differences among operators. A charged particle beam device includes an ion beam optical system device configured to irradiate a sample with an ion beam generated at an ion source; a controller thereof; an element detector configured to detect elements constituting the sample; a controller thereof; and a central processor configured to automatically set conditions for the sample based on the element specified by the element detector.

29 Claims, 12 Drawing Sheets

(51) Int. Cl.
*H01J 37/30* (2006.01)
*H01J 37/304* (2006.01)

(56) References Cited

U.S. PATENT DOCUMENTS

| | | | |
|---|---|---|---|
| 2005/0082478 | A1 | 4/2005 | Tanaka et al. |
| 2006/0289801 | A1* | 12/2006 | Matsuba .................. 250/492.21 |
| 2007/0187597 | A1 | 8/2007 | Suzuki et al. |
| 2008/0029699 | A1 | 2/2008 | Kaneoka et al. |

FOREIGN PATENT DOCUMENTS

| | | |
|---|---|---|
| JP | 57-050290 A | 3/1982 |
| JP | 59-148064 U | 10/1984 |
| JP | 05-267409 A | 10/1993 |
| JP | 6-231719 A | 8/1994 |
| JP | 2001-084951 A | 3/2001 |
| JP | 2002-117798 A | 4/2002 |
| JP | 2004-349118 A | 12/2004 |
| JP | 2005-077244 A | 3/2005 |
| JP | 2007-214088 A | 8/2007 |

OTHER PUBLICATIONS

German Office Action, w/ English translation thereof, issued in German Application No. 11 2012 002 145.2 dated Feb. 19, 2014.
L.A. Giannuzzi et al., "Particle-induced x-ray emission in stainless steel using 30 keV Ga + focused ion beams," Journal of Vacuum Science & Technology A 27, 668-671, (2009) (in English).
Office Action issued in CN201280028058.6 dated May 14, 2014, with English translation.
Japanese Office Action issued in Japanese Application No. 2011-126235 dated Jul. 29, 2014.

* cited by examiner

CHARGED PARTICLE BEAM DEVICE AND SAMPLE PRODUCTION METHOD

RELATED APPLICATIONS

This application is the U.S. National Phase under 35 U.S.C. §371 of International Application No. PCT/JP2012/062469, filed on May 16, 2012, which in turn claims the benefit of Japanese Application No. 2011-126235, filed on Jun. 6, 2011, the disclosures of which Applications are incorporated by reference herein.

TECHNICAL FIELD

The present invention relates to a charged particle beam device including a device to irradiate a sample with an ion beam for processing, and a method for producing a sample using the device.

BACKGROUND ART

Devices to micro-fabricate a sample precisely include a focused ion beam (hereinafter called FIB) milling device. The FIB milling device irradiates a sample with an ion beam focused to sub-micron order while scanning the ion beam by electrostatic deflection, thus processing the sample at a target position into a desired shape.

Such processing using an ion beam needs sufficient knowledge about constituent elements, for example, of a sample to be processed. This is because the sputtering yield [$\mu m^3/nA \cdot s$] of the ion beam depends on the constituent elements.

When the materials and the structure of a sample are known, a skilled worker firstly finds the sputtering yield therefor, decides a relation among a beam current of the FIB milling device, beam residence time (hereinafter called dwell time) per unit area, and a milling depth, and then processes the sample.

On the other hand, when the materials and the structure of a sample are uncertain, a skilled worker analyzes the constituent elements or checks the design beforehand to decide an area to be processed, and then actually processes the decided area to be processed. By repeating this operation, the skilled worker creates the fabrication procedure to achieve a desired shape.

When the materials and the structure of a sample are uncertain, a FIB beam at a low energy level has to be used for the FIB milling. This means a low processing speed of the milling. The FIB milling further needs to successively change the conditions depending on a material appearing on the surface of the sample and a change in shape of the sample during the milling. Therefore the finished quality of the sample often depends on the skill of the worker.

One of FIB devices available enables the analysis of constituent elements of a sample using an energy dispersive X-ray spectrometer (EDS) while processing the sample by a FIB (see Patent Literature 1).

CITATION LIST

Patent Literature

Patent Literature 1: JP Patent 2001-084951A

SUMMARY OF INVENTION

Technical Problem

The FIB device shown in Patent Literature 1 also requires an operator to change the conditions in accordance with the analysis result observed and the state of the FIB milling process. That is, the operator has to change the conditions successively in accordance with a material appearing on the surface of the sample and a change in shape of the sample during milling.

In this way, since the FIB milling has sample dependency resulting from the constituent elements of the sample, the operator has to have knowledge about how to select the optimum conditions in accordance with the situation of the sample surface. Without such knowledge, the operator cannot process the sample into a desired shape effectively even when the operator can observe a result of the analysis.

As a result of further investigations on the aforementioned problems, the present inventors propose a charged particle beam device having a function of automatically setting conditions for efficient processing of a sample into a desired shape, and a sample production method based on such a function.

Solution to Problem

A charged particle beam device of the present invention includes an ion beam optical system device to irradiate a sample with an ion beam generated at an ion source; a controller thereof; an element detector to detect an element constituting the sample; a controller thereof; and a central processor to automatically set conditions for the ion beam optical system device based on the element specified by the element detector. Further, the present invention proposes a method for producing a sample though a setting of conditions automatically set by a controller.

Advantageous Effects of Invention

The present invention enables automatic setting of conditions for processing of a specific material only of a sample or processing to leave a specific material, or for flat processing irrespective of differences in material, even when the sample is a composite material whose materials and structure are unknown or materials only are unknown. This enables FIB milling of a sample including unknown constituent elements into a desired shape without influences of the skill of the operator, for example.

Problems, configurations, and advantageous effects other than those described above will be made clear by the following description of embodiments.

DESCRIPTION OF EMBODIMENTS

The following describes embodiments of the present invention with reference to the drawings. Embodiments of the present invention are not limited to the below-described examples, and can be modified variously within the scope of its technical idea.

Embodiment 1

[Device Configuration]

Figure 1:
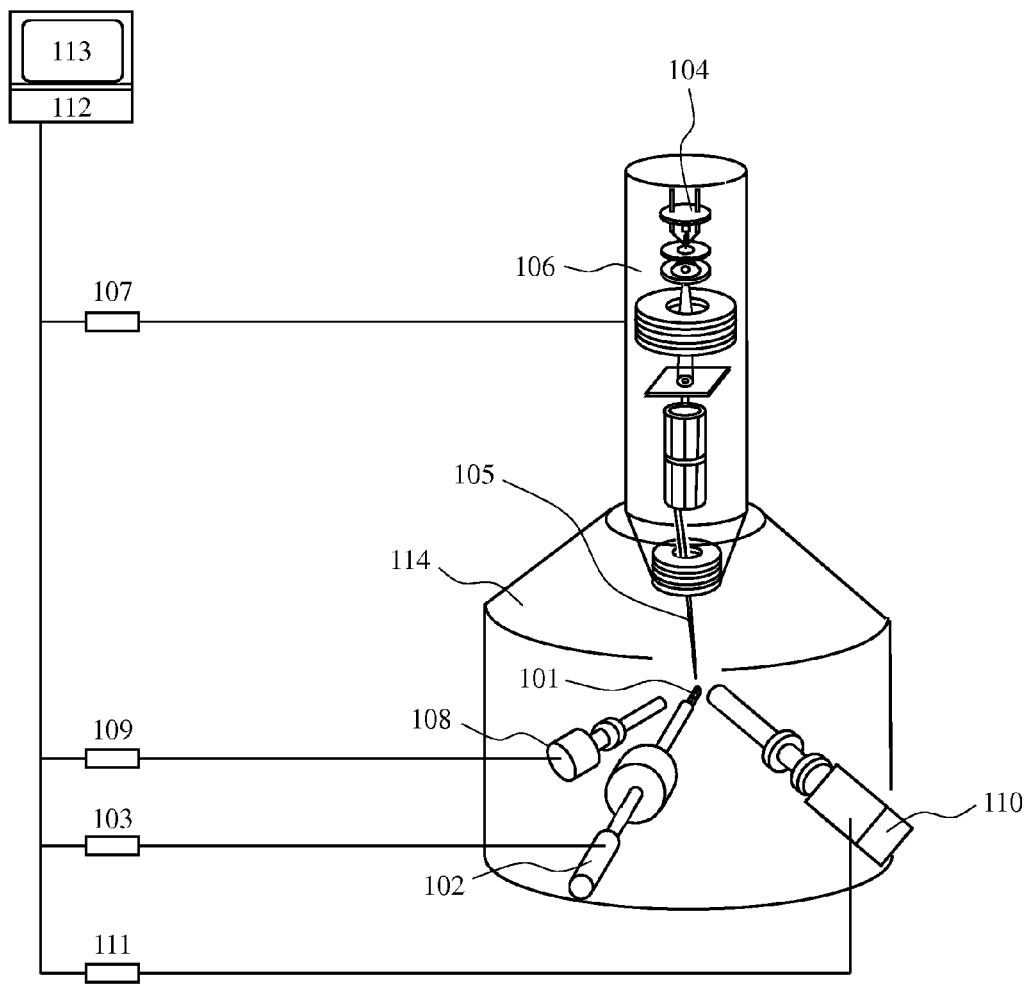
FIG. 1 shows an exemplary configuration of a charged particle beam device according to one embodiment of the present invention.

FIG. 1 shows an exemplary configuration of a charged particle beam device according to Embodiment 1. The charged particle beam device according to the present embodiment is a FIB milling device.

The FIB milling device includes: a sample stage 102; a sample position controller 103; an ion source 104; an ion beam optical system device 106; an ion beam optical system controller 107; a secondary electron detector 108; a secondary electron detector controller 109; an element detector 110; an element detector controller 111; a central processor 112; a display 113 and a vacuum vessel 114.

The sample stage 102, the ion beam optical system device 106, the secondary electron detector 108 and the element detector 110 are disposed in the vacuum vessel 114. Inside of the vacuum vessel 114 is kept at a vacuum atmosphere.

The sample stage 102 is to place a sample 101 to be processed thereon. The position and the orientation of the sample stage 102 can be changed by a driving mechanism not illustrated. The driving mechanism is controlled by the sample position controller 103. Such control changes the position and the orientation of the sample 101 with reference to an ion beam.

The ion source 104 generates ions that are used for processing of the sample 101. The ion beam optical system device 106 irradiates the sample 101 with an ion beam 105 focused to be a predetermined beam diameter, thus processing the sample 101 into a desired shape. The ion beam optical system controller 107 controls deflection scanning, for example, of the ion beam 105 focused to be a predetermined beam diameter.

The secondary electron detector 108 detects secondary electrons generated from the sample 101 that is irradiated with the ion beam 105. Detected intensity of such secondary electrons is associated with an irradiation position of the ion beam 105 to be an image, which is a secondary electron image (SEM image). The detection of secondary electrons by the secondary electron detector 108 is controlled by the secondary electron detector controller 109. An image of a sample surface may be acquired by detecting secondary ions or other secondary signals.

The element detector 110 specifies an element existing at the irradiation position of a FIB on the basis of a signal generated by the irradiation of the FIB. Such detection of an element by the element detector 110 is controlled by the element detector controller 111.

The central processor 112 controls these devices by controlling the sample position controller 103, the ion beam optical system controller 107, the secondary electron detector controller 109 and the element detector controller 111. The central processor 112 calculates control data for the sample position controller 103, the ion beam optical system controller 107, the secondary electron detector controller 109 and the element detector controller 111, and transmits the calculation result to their corresponding controllers. The central processor 112 may be a personal computer, a workstation or the like. The central processor 112 is connected to the display 113, on which a GUI is displayed. An operator inputs or checks conditions through the GUI.

The FIB milling device of FIG. 1 has a function of automatically setting optimum conditions for a sample 101 to be processed on the basis of an element specified by the element detector 110 even when the materials and the structure of the sample 101 are unknown, and performs FIB milling of the sample 101 effectively to be in a desired shape based on the function. As described later, the function of automatically setting conditions is implemented through the processing function of the central processor 112.

[Element Detector]

The aforementioned element detector 110 may be basically any device as long as it can specify an element. In this embodiment, the element detector 110 used is an ion detector to detect secondary ions of an element sputtered from the sample 101 irradiated with the ion beam 105.

Herein the ion detector refers to a part of a secondary ion mass spectrometer including a mass spectrometric part and an ion detector. Ion detectors can be classified into a magnetic field type, a quadruple type, a time-of-flight type, a composite type including the combination of them and the like in accordance with differences in configuration of the mass spectrometric parts. The ion detector in the present specification refers to any one of them.

The ion detector can detect the distribution of elements at the outermost surface of the sample 101 with high resolution. Then the central processor 112 generates an elemental mapping image based on the ion beam irradiation position and the elemental distribution detected at the position.

[Conditions]

Conditions refer to those used for FIB milling. Conditions include the presence or absence of a processing target, a material, sputtering yield, a processing area, beam current, a milling depth, milling time, a FIB milling pattern, dwell time, displayed colors of materials to display a FIB milling pattern and elemental mapping, coordinates of the sample stage and the like.

The FIB milling pattern is a chart to show an area to be processed with the ion beam 105. The pattern is displayed on a GUI. The FIB milling pattern and the conditions are associated with each other. Therefore a change in the area to be processed, for example, changes accordingly the FIB milling pattern.

[Processing Operation]

The following describes a FIB milling operation by the FIB milling device shown in FIG. 1. The following description assumes the case where the sample 101 is a composite sample whose materials and structure are not specified, and such a sample 101 is subjected to FIB milling in a material-selective manner.

Figure 2:
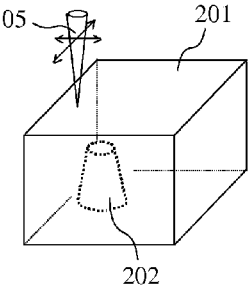
FIG. 2 shows the processing principle according to Embodiment 1.

FIG. 2 shows the principle of the operation for FIB milling of the sample 101 in a material-selective manner. Herein, the material-selective manner refers to processing of only a part of materials among a plurality of materials. The sample 101 has a rectangular parallelepiped shape before processing. This sample 101 has a surface covered with a first material 201 whose material and structure are not specified, inside which a second material 202 is included, whose material and structure are not specified. The drawing shows the second material 202 that is not visible externally with dotted lines. Such a structure is of course unknown at the initiation stage of the FIB milling.

The sample 101 has one face that is positioned by the sample position controller 103 so as to be perpendicular to the irradiation axis of the ion beam 105. That is, the sample surface irradiated with the ion beam 105 and the deflection scanning face of the ion beam 105 are arranged in parallel.

In this state, the FIB milling starts. Firstly the FIB milling device (specifically the central processor 112, hereinafter the same applies) sets the entire surface of the sample to be irradiated with the ion beam 105 as a FIB milling pattern 203. This is because the distribution of elements constituting the surface of the sample is unknown. That is, at the initiation stage of the FIB milling, deflection-scanning of the ion beam 105 is performed at the entire irradiation face. When a partial area of the surface of the sample is set as an area to be processed based on a secondary-electron image acquired beforehand, such a processing area as a whole is set as the FIB milling pattern 203, and deflection-scanning of the ion beam 105 is performed at the entire area.

The FIB milling device then detects secondary ions sputtered with the element detector 110. The central processor 112 analyzes elements thereof and creates an elemental mapping image. That is, the central processor 112 identifies an element(s) of a material constituting the surface of the sample 101 and creates an elemental mapping image for every deflection scanning (for each frame).

In the case of FIG. 2, at the initiation stage of the processing, the first material 201 only is exposed at the surface of the sample. Therefore the first material 201 at the surface of the sample 105 is uniformly processed. This processing of the first material 201 is continuously performed until a different type of material appears at the surface of the sample. When an elemental mapping image is created, the FIB milling device sets a next FIB milling pattern 203 on the basis of such an elemental mapping image. In this example, since the first material 201 is uniformly distributed at the surface of the sample, the sample surface as a whole is set as the FIB milling pattern 203.

When a different type of material appears at the surface of the sample, the operation is as follows. In this case, the FIB milling device detects the appearance of the second material 202 that is different from the first material 201 and the appearing position on the basis of the elemental mapping image created for every deflection-scanning of FIB. At this time, the FIB milling device creates a FIB milling pattern 203 so as to remove the second material 202 from the processing area. That is, the FIB milling device creates the FIB milling pattern 203 to selectively process the first material 201 only. In the FIB milling pattern 203 of FIG. 2, a white area corresponds to the second material 202 and a shaded area surrounding the white area corresponds to the first material 201.

In this way, the FIB milling pattern 203 is automatically updated in association with the updating of the elemental mapping image. When the shape or the position of the second material 202 changes with the depth, the FIB milling device can respond to such a change automatically. That is, the FIB milling device can automatically create a FIB milling pattern 203 so as to remove the second material 202 only from the processing area. This automatic setting operation of the processing area is continuously executed until the FIB milling ends. In the case of FIG. 2, the processing ends while leaving the truncated cone shaped second material 202 without being milled. In this way, the FIB milling device according to the present embodiment can automatically and selectively process the first material 201 only even when the material and the structure of the sample 101 are unknown.

The above description deals with the case where the sample 101 includes the first material 201 and the second material 202 only, and the sample 101 may include a third material and other types of materials. In this case also, the first material 201 only can be selected as the processing target.

In the above description, the second material 202 exists as a chunk. Instead, the second material 202 may exist at a plurality of positions at the surface of the sample. FIG. 2 shows the case where the first material 201 constitutes the outside of the sample 101 and the second material 202 exists inside the sample 101, and they may have an inverse positional relationship. When these materials have an inverse positional relationship, the FIB milling device selectively processes the second material 202 only that is positioned outside.

[Processing Procedure]

Figure 3:
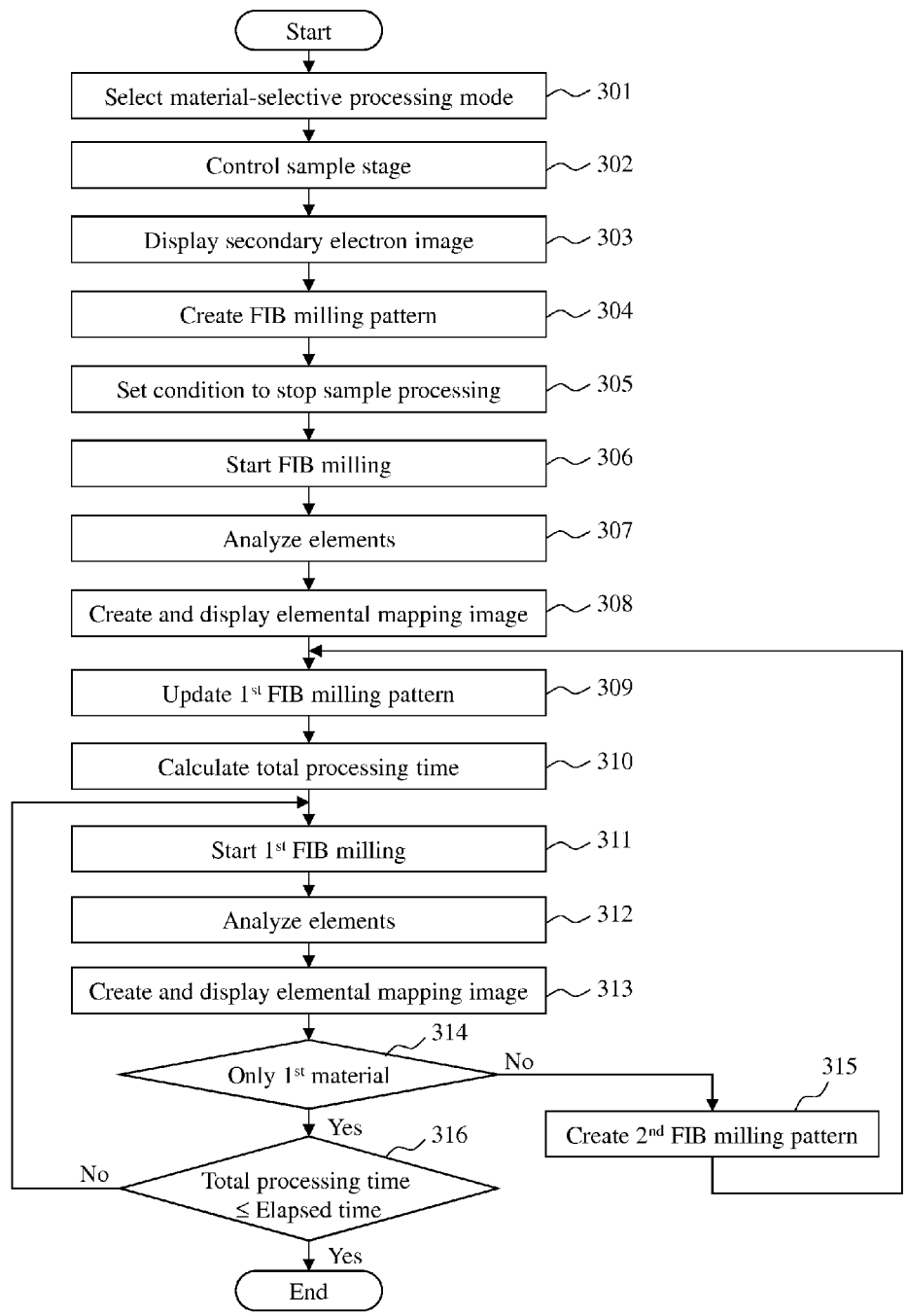
FIG. 3 is a flowchart showing a sample production method according to Embodiment 1.

FIG. 3 shows exemplary processing procedure by the central processor 112 to perform material-selective FIB milling of a sample 101 that is a composite sample whose materials and structure are not specified. The following description assumes a quadruple-type ion detector as the element detector 110.

Firstly, the operator inputs to the FIB milling device (specifically to the central processor 112) so as to perform FIB milling of the sample 101 in a material-selective manner (Step 301). For instance, the operator selects a material selective processing mode on a selection screen for processing mode.

Next, the operator controls the sample stage 102 to move the sample 101 to an irradiation range of the ion beam 105 (Step 302). At this time, the operator instructs the central processor 112 to adjust the position and the orientation of the sample stage 102 via a peripheral device not illustrated. The central processor 112 generates control data in accordance with the instruction and transmits the control data to the sample position controller 103 to position the sample stage 102.

Next, the operator observes, on a GUI, a secondary electron image that is an image of secondary electrons emitted from the sample 101 at a position irradiated with the ion beam 105 (Step 303). At this time, the central processor 112 maps the signal intensity of secondary electrons detected by the secondary electron detector 108 on irradiation coordinates, thus creating a secondary electron image, and displays the secondary electron image on a screen.

Next, the operator observing the secondary electron image of the sample 101 decides a target position, creates a FIB milling pattern 203 indicating a processing area and overlaps the FIB milling pattern 203 on the target position (Step 304). As described referring to FIG. 2, the maximum range of the processing area is given as the FIB milling pattern 203.

Next, the operator sets a condition to stop the processing of the sample 101 (Step 305). The condition to stop the processing of the sample includes processing time or a milling depth, for example, which is one of the conditions to be set. In the present embodiment, the operator selects a milling depth.

Then the operator instructs the FIB milling device to start the FIB milling (Step 306). Following this operation, the FIB milling device starts the processing of the sample 101 with the ion beam 105 in accordance with the conditions (processing mode, a stopping condition and the like) stored in a storage area not illustrated.

When starting the processing, the FIB milling device detects an element(s) at the surface of the sample while performing FIB milling, and analyzes the element(s) (Step 307). An elemental distribution chart showing the result of element analysis at points on the coordinates irradiated with the ion beam 105 is changed with the movement of the irradiation position with the ion beam 105.

Next, after processing of the area corresponding to one frame (i.e., after processing the area set by one FIB milling pattern 203), the FIB milling device associates the elemental distribution chart with points on the coordinates, thus creating an elemental mapping image, and displays the elemental mapping image on the display 113 (Step 308). The thus created elemental mapping image is used at the following Step 309 as well.

The FIB milling device specifies the distribution of elements (in the present embodiment, the first material 201) at the sample face based on the elemental mapping image, and automatically updates the FIB milling pattern 203 on the basis of the distribution of the elements (Step 309). Such a FIB milling pattern 203 for the first material 201 created from the elemental mapping image is referred to as a first FIB milling pattern in the present specification. Conditions associated with the first FIB milling pattern are referred to as first conditions.

When the elements as a processing target are found in this way, then its processing area and sputtering yield are determined automatically. Then, the FIB milling device calculates time required for FIB milling of the first material 201 (processing time) on the basis of "dwell time" and "milling depth" designated at Step 305.

Next, the FIB milling device updates total processing time to cope with the case including a plurality of FIB milling patterns (Step 310). In the case of the present embodiment, since the material to be processed is the first material 201 only, the processing time of the first material 201 equals the total processing time.

Next, the FIB milling device starts the FIB milling of the first material 201 in accordance with the first conditions (Step 311), analyzes elements (Step 312) and creates an elemental mapping image for display (Step 313).

Next, the FIB milling device determines whether the elemental mapping image includes the first material 201 only or not (Step 314).

At this step, when the result is No (in the present embodiment, when the image includes the second material 202), the FIB milling device newly creates a second FIB milling pattern indicating a partial area of the secondary electron image where the second material 202 exists (Step 315). Then, second conditions associated with the second FIB milling pattern are automatically set similarly to the first conditions. In the present embodiment, since the second material 202 is not a processing target, the created second conditions are not used.

Then, the FIB milling device returns to Step 309 to update the first FIB milling pattern. Specifically, the FIB milling device removes the area of the second material 202 from the first FIB milling pattern 203, thus updating the first FIB milling pattern 203 (Step 309). Then, the FIB milling device calculates the total processing time again.

At Step 314, when the result is Yes, the FIB milling device determines whether the total processing time found at Step 310 has passed or not (Step 316). While the result is No, the FIB milling device returns to Step 311 to continue the FIB milling. When the result becomes Yes at Step 316, then the FIB milling device stops the FIB milling.

[Modification Examples of Processing Procedure]

In FIG. 3, the first material 201 is determined as the processing target at Step 309. Alternatively such determination may be made at Step 303 to search for the target position of the sample 101. That is, in parallel with the creation of a secondary electron image by the secondary electron detector 108, analysis of the element by the element detector 110 and creation of an elemental mapping image may be executed, and on the basis of the analysis result, the first material 201 may be determined as the processing target. In this way, a secondary electron image and an elemental mapping image may be concurrently created by one irradiation with the ion beam 105 for better operation efficiency.

At Step 304 of FIG. 3, the FIB milling pattern 203 is created using a secondary electron image. Instead of the secondary electron image, an elemental mapping image and the like may be used for this purpose. The image used has to be an image of the sample 101 acquired by scanning of the ion beam 105. The thus acquired image has the same deflection scanning information as the information that the ion beam 105 used for the FIB milling has. Therefore this type of image used prevents an error between the region designated as the FIB milling pattern 203 and the actual processing position.

At Step 308, an elemental mapping image is created on the basis of an elemental distribution chart corresponding to points on the coordinates detected during processing of one frame. Instead, an average elemental mapping image may be used, obtained by averaging a plurality of elemental mapping images created during processing of two or more frames. The average elemental mapping image can improve reliability of the elemental mapping image.

The elemental mapping image created at Step 308 may include two or more materials. In that case, the FIB milling device urges the operator to select a material as a processing target by inputting, and then the operator selects the processing target via the GUI. Herein the material can be selected without a selection operation by the operator. For instance, a condition to select a processing material may be set beforehand, whereby the FIB milling device can automatically recognize the processing target. The condition to select a processing material may be to select a material occupying a large area in the selected area or a material having a larger atomic weight than that of a certain material, for example.

In the above description, the second FIB milling pattern 203 created at Step 315 is removed from the processing target. However when the second material 202 falls within the condition to select a processing material, the material automatically becomes a processing target.

In FIG. 3, after the FIB milling by the first FIB milling pattern 203 ends, the second FIB milling pattern 203 is created. Instead, during the FIB milling by the first FIB milling pattern 203, the operator observing an elemental mapping image that is updated in real time may set the second FIB milling pattern 203 being created as a processing target. During scanning of the ion beam 105, the operator may instruct to stop the creation of the second FIB milling pattern 203 or to discard the same.

Although not mentioned in the above, during the FIB milling from Step 309 to Step 316, the position and the orientation of the sample stage 102 may be controlled. For instance, when the conditions include an inclination angle, the FIB milling device can incline the sample 101 with reference to the irradiation axis of the ion beam 105 during the FIB milling. In this case, a processing target material, which is located at an area where the material cannot be irradiated with the ion beam 105 at the inclination angle of zero, can be irradiated with the ion beam 105 for FIB milling.

[GUI]

The following describes exemplary GUI screens that are used in a FIB milling device according to the present embodiment.

[GUI to Set Conditions]

Figure 4:
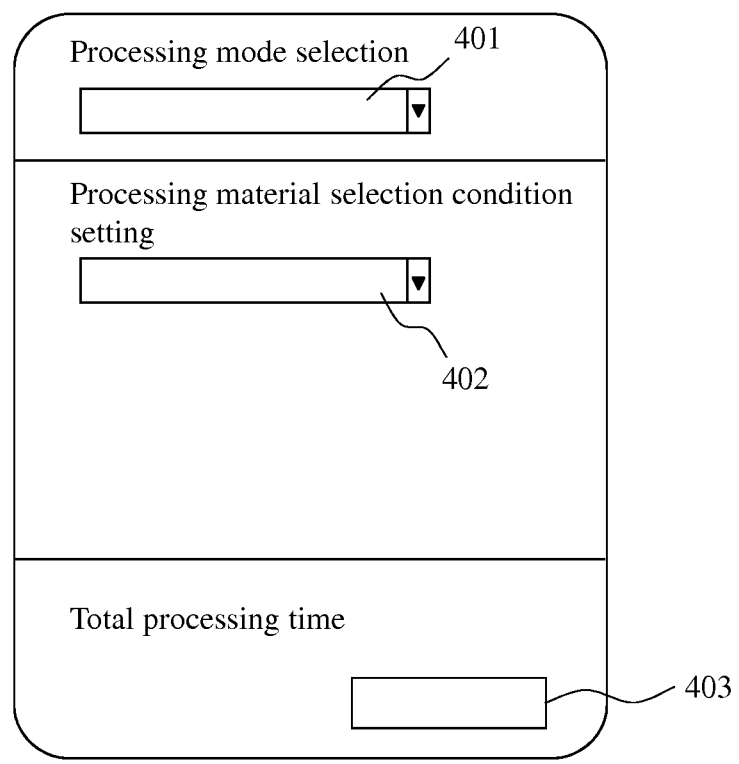
FIG. 4 shows a GUI screen to set a processing mode and a processing material selection condition.

FIG. 4 shows an exemplary screen of a GUI relating to Step 301 and Step 310. FIG. 4 displays three fields of processing mode selection pull-down 401, processing material selection condition setting pull-down 402 and total processing time 403.

The processing mode selection pull-down 401 displays selectable processing modes in the pull-down form. The processing modes includes, for example, a material selective processing mode where processing is performed in a material-selective manner and a flat processing mode where processing is performed to be a uniform depth irrespective of different types of materials included.

The processing material selection condition setting pull-down 402 allows an operator to set detailed conditions on the processing mode individually. The detailed conditions correspond to various conditions used for FIB milling of different materials. As described later, the screen to set the detailed conditions displays items to be designated in accordance with the operator's determination. These designated items are available not only for the instruction input but also for checking of current setting conditions. These designated items displayed can reduce an error in setting range or forgetting to setting by an operator, and so can prevent a failure in processing.

The total processing time 403 displays a totally calculated result for individual processing periods corresponding to one or a plurality of FIB milling patterns 203.

Figure 5:
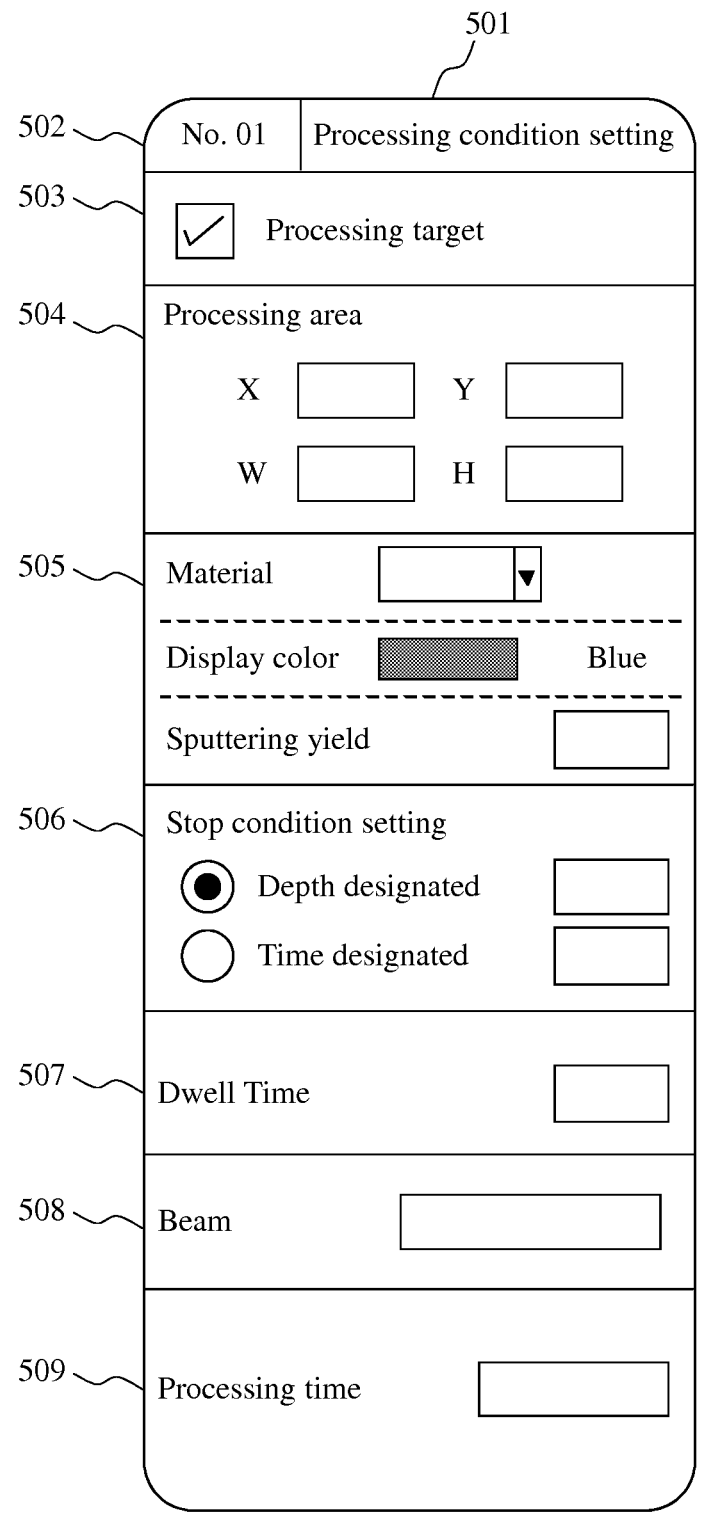
FIG. 5 shows a GUI screen to set and check conditions.

FIG. 5 shows an exemplary screen of a GUI relating to Step 304, Step 309 and Step 315. A conditions setting screen 501 shown in FIG. 5 may be displayed when the operator manipulates the processing material selection condition setting pull-down 402, for example.

The conditions setting screen 501 is a screen to set conditions associated with a FIB milling pattern 203. One conditions setting screen 501 is prepared for each material.

The conditions setting screen 501 displays a management number display part 502, a processing target switching display part 503, a processing area display part 504, a material setting display part 505, a stop condition setting display part 506, a dwell time setting display part 507, a beam condition setting display part 508 and a processing time display part 509.

Whether checking or not of the processing target switching display part 503 shows whether a corresponding material is a target of FIB milling or not. As shown in FIG. 5, when it is checked, the corresponding material is a target of FIB milling.

The processing area display part 504 is used to designate a processing area of each material.

The material setting display part 505 is used, for example, to designate or check a material, to which conditions are to be applied, and to set a display color for each material when an elemental mapping image, for example, is displayed. Sputtering yield of the corresponding material also is displayed here.

The stop condition setting display part 506 is used to select a stopping condition of FIB milling and to input specific numerals.

The dwell time setting display part 507 and the beam condition setting display part 508 allow an operator to designate and input numerals and check current values. The processing time display part 509 displays time required for processing of the material under the set conditions, which is calculated by the central processor 112.

Although not illustrated in FIG. 5, the screen may additionally include, for example, a stage inclination angle and a threshold of an elemental distribution chart described later. These displayed items allow an operator to manage conditions for each FIB milling pattern 203. When the field for material is not filled, the name of a material (element) that is analyzed based on the first frame is automatically input. This allows an operator who does not have knowledge about the sample 101 to know what materials the sample 101 includes.

Figure 6:
FIG. 6 shows a GUI screen to set and check conditions that is preferable for a plurality of processing materials.

A screen including a list form shown in FIG. 6 (conditions setting list display screen 601) is preferably created in preparation for the case including a plurality of materials. Such a screen in the list form facilitates comparison of items among materials and so facilitates understanding of the overall image of the sample.

[GUI During Milling Operation]

Figure 7:
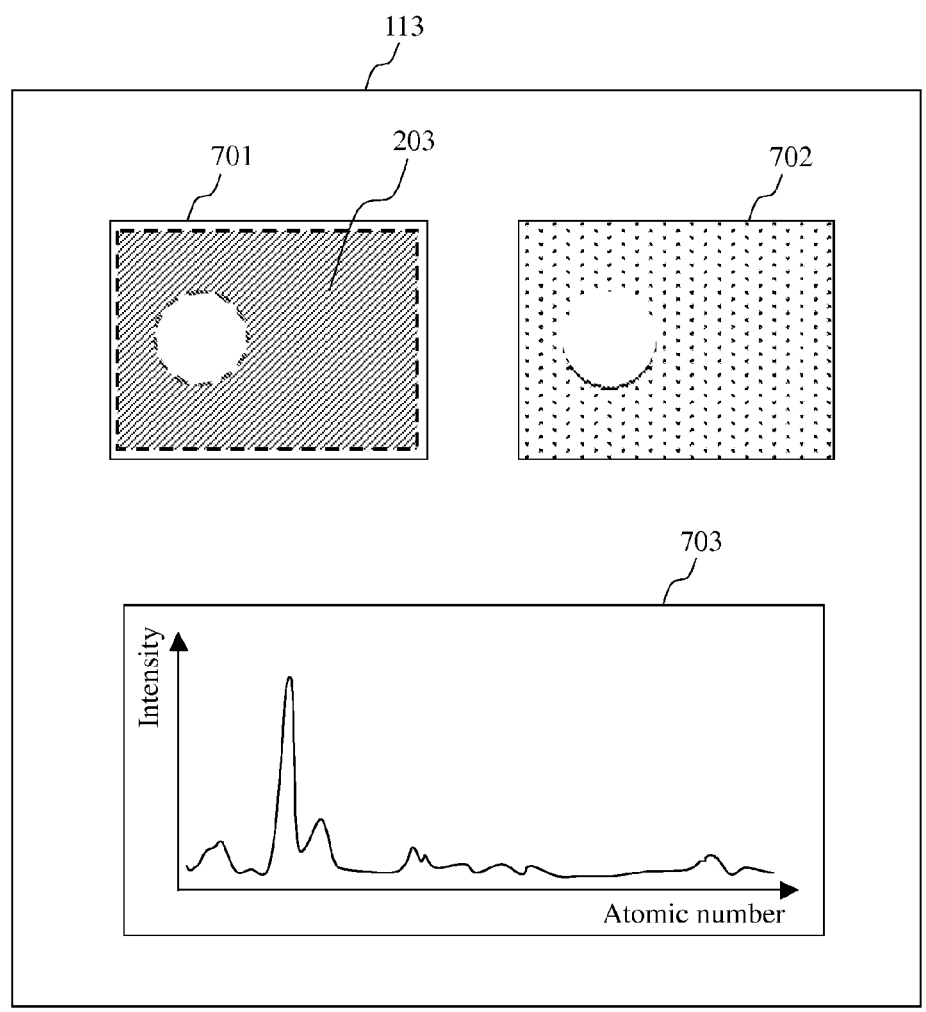
FIG. 7 shows a GUI screen to check a processing pattern that is used during FIB milling.

FIG. 7 shows an exemplary screen of a GUI that is displayed during FIB milling. The GUI shown in FIG. 7 displays a secondary electron image display part 701, an elemental mapping image display part 702 and an elemental distribution display part 703. The secondary electron image display part 701 displays a FIB milling pattern 203 that is created with the same scale as that of the secondary electron image in a superimposed manner.

Such display parts allow an operator to know about a material at the sample surface that is changed with the progress of the FIB milling and a change of the FIB milling pattern 203 in real time. The elemental mapping image display part 702 displays a major element only. In this embodiment, an element having intensity larger than a predetermined threshold at the elemental distribution display part 703 refers to as the major element. Although the elemental mapping image display part 702 displays the major element only, the operator can understand the elemental distribution in details based on what is displayed at the elemental distribution display part 703.

Figure 8:
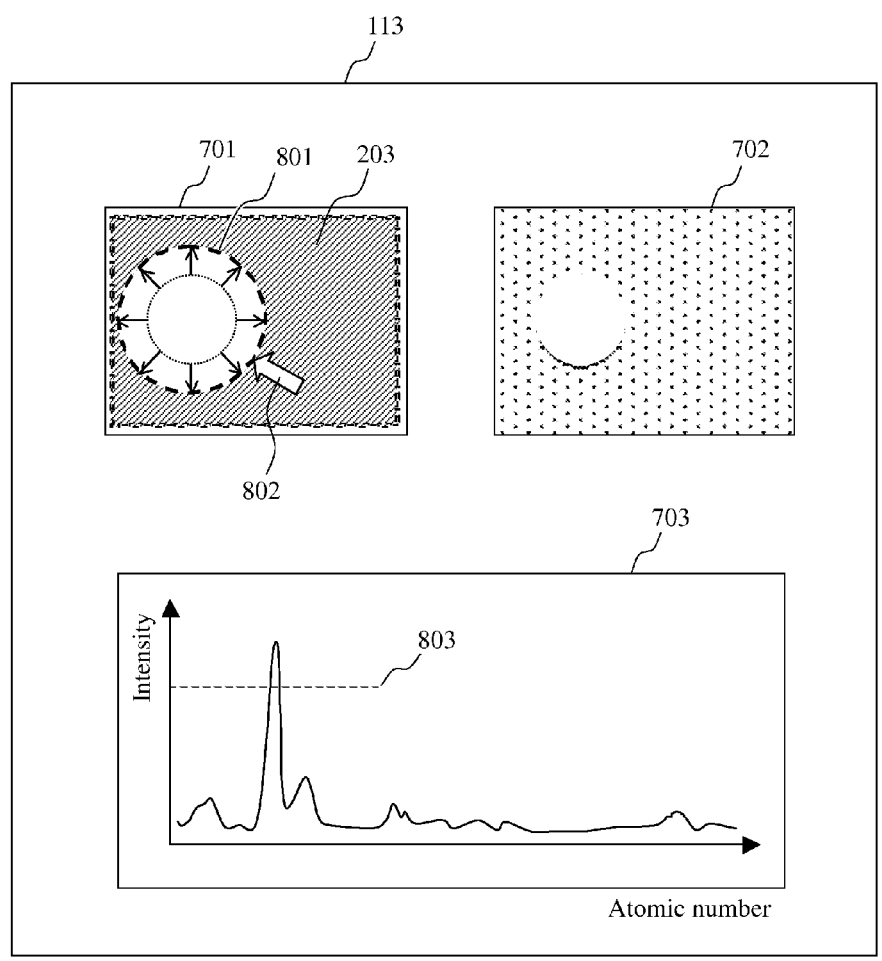
FIG. 8 shows another GUI screen to check a processing pattern that is used during FIB milling.

FIG. 8 shows an exemplary screen of a GUI that is preferably used by an operator to adjust the FIB milling pattern 203. The ion beam 105 has a spot diameter of about several tens nm. FIB milling at a boundary part of different types of materials using such an ion beam will detect elements related to two or more types of materials. That is, the boundary of a processing area becomes blurry, thus erroneously removing the sample too much. To avoid this, a mechanism to adjust the boundary of the processing area is preferably included. Methods for such adjustment include a method to adjust the FIB milling pattern 203 and a method to adjust a threshold to create an elemental mapping image.

In the former method, a distance (μm) to widen (or narrow) the edge position detected as the boundary with a not-processing part of the FIB milling pattern with reference to a processing area can be set at the processing material selection condition setting pull-down 402, for example. In another method, an operator directly adjusts the boundary position by dragging a boundary part 801 of the FIB milling pattern 203 with a mouse cursor 802.

In the latter method, the height (magnitude) of a threshold 803 at the elemental distribution display part 703 is adjusted. An element falling below the threshold 803 is excluded from the processing target, and an element exceeding the threshold 803 is set as the processing target. When an operator adjusts the height (magnitude) of the threshold 803, the shape of the edge giving the boundary of the elemental mapping image display part 702 changes, and a result thereof is reflected on the shape of the FIB milling pattern 203 as well.

In any method, such an adjusting function enables the processing reflecting the intention of the operator more in the FIB milling pattern 203.

Figures 9, 10:
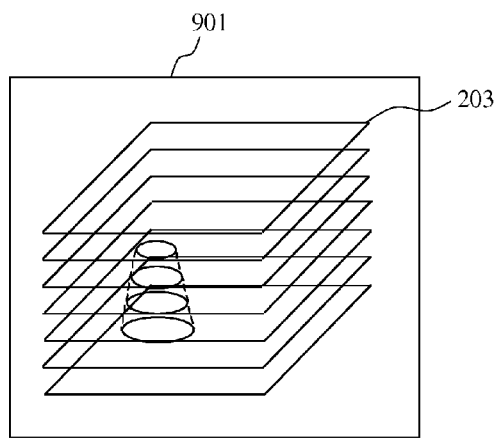
FIG. 9 is a three-dimensionally composite chart of a plurality of processing patterns that are created sequentially during FIB milling.
FIG. 10 shows the processing principle according to Embodiment 2.

FIG. 9 is a three-dimensional display chart 901 representing a time change of the FIB milling pattern 203 three-dimensionally. The three-dimensional display chart 901 corresponds to a time-series composite chart of the FIB milling pattern 203.

FIG. 9 simply shows the composite result of all of the FIB milling patterns 203 created during the FIB milling, which may be displayed as a three-dimensional display of cross-sectional slices by superimposing the FIB milling patterns 203 each corresponding to one frame sequentially. Such display can be easily recognized visually. Incidentally, a three-dimensional image may be displayed including the composition of non-processing areas of frames only.

In the above description, the FIB milling pattern 203 is created using an elemental mapping image, which is not always necessary. For instance, the FIB milling pattern 203 may be created using a secondary electron image and a result of elemental analysis. In this way, creation of an elemental mapping image may be omitted, whereby time required to create the FIB milling pattern 203 can be shortened. This can reduce the processing load of the central processor 112 as well.

[Summary]

As described above, the FIB milling device of the present embodiment enables automatic creation of a FIB milling pattern 203 for each scanning of the ion beam 105, even when the sample 101 whose material and structure are unknown. This can realize FIB milling in a material-selective manner without influences of the skill or individual differences among operators.

An elemental distribution chart, an elemental mapping chart, a FIB milling pattern 203 and the like are displayed in real time during the FIB milling as well, whereby an operator can monitor the creation operation of the FIB milling pattern 203 that is performed full-automatically.

The present embodiment is provided with a function enabling three-dimensional composition of FIB milling patterns 203 generated chronologically during FIB milling or after milling, whereby the procedure of the FIB milling, for example, can be easily checked.

When a material corresponding to the FIB milling pattern 203 is unknown, the FIB milling device automatically detects an element for setting, thus reducing burden on the operator.

Embodiment 2

The present embodiment describes the case of FIB milling of a composite sample 101 to be flat when the material and the structure of the sample 101 are unknown. The FIB milling device according to the present embodiment has the same configuration as that of Embodiment 1, and so the descriptions on the device configuration are omitted. A difference in function specifically resides in the selection of processing modes.

[FIB Milling Operation]

FIG. 10 shows the principle of the operation for flat FIB milling of a composite sample 101 whose materials and structure are unknown. The appearance and the shape of the sample 101 in this embodiment have the same as those in Embodiment 1. That is, the sample 101 has a rectangular parallelepiped shape, and has an outermost surface covered with a first material 201 whose material and structure are not specified, inside which a second material 202 is included, whose material and structure are not specified. The drawing shows the second material 202 that is not visible externally with dotted lines. Such a structure is of course unknown at the initiation stage of the FIB milling.

The sample 101 has one face that is positioned by the sample position controller 103 so as to be perpendicular to the irradiation axis of the ion beam 105. That is, the sample surface irradiated with the ion beam 105 and the deflection scanning face of the ion beam 105 are arranged in parallel.

In this state, the FIB milling starts. Firstly the FIB milling device (specifically the central processor 112, hereinafter the same applies) sets the entire surface of the sample to be irradiated with the ion beam 105 as a FIB milling pattern 203.

The FIB milling device detects secondary ions sputtered with the element detector 110. The central processor 112 analyzes elements thereof and creates an elemental mapping image. That is, the central processor 112 identifies an element (s) of a material constituting the surface of the sample 101 and creates an elemental mapping image for every deflection scanning (for every milling depth).

In the case of FIG. 10, at the initiation stage of the processing, the first material 201 only is exposed at the surface of the sample. Therefore the first material 201 at the surface of the sample 105 is uniformly processed. This processing of the first material 201 is continuously performed until a different type of material appears at the surface of the sample. When an elemental mapping image is created, the FIB milling device sets a next FIB milling pattern 203 on the basis of such an elemental mapping image. In this case, since the first material 201 is uniformly distributed at the surface of the sample, the sample surface as a whole is set as the FIB milling pattern 203.

When a different type of material appears at the surface of the sample, the operation is as follows. In this case, the FIB milling device detects the appearance of the second material 202 that is different from the first material 201 and the appearing position on the basis of the elemental mapping image created for every deflection-scanning of FIB. At this time, the FIB milling device newly creates a FIB milling pattern 1001 of the second material 202 apart from the FIB milling pattern 203 of the first material 201.

Herein the FIB milling device determines each dwell time of the FIB milling pattern 203 and the FIB milling pattern 1001 so as to balance the sputtering yield between the first material 201 and the second material. For instance, when the sputtering yield of the second material 202 is lower than that of the first material 201, FIB milling by the two processing patterns using the same dwell time means that FIB milling of the second material 202 delays than that of the first material 201. Then, the FIB milling device of the present embodiment sets longer dwell time for the second material 202 corresponding to the delay of the FIB milling, thus adjusting so that the processing amount becomes equal between the two patterns during one scanning of the ion beam 105.

Subsequently the FIB milling device performs FIB milling of the sample 101 using the FIB milling pattern 203 and the FIB milling pattern 1001 having different values of dwell time. As described in Embodiment 1, as the elemental mapping image is updated, the shapes of the FIB milling pattern 203 and the FIB milling pattern 1001 also are updated. This means that, even when the elemental distribution changes with the depth position of the sample 101, the FIB milling device can adaptively change the FIB milling pattern 203 and the FIB milling pattern 1001 depending on the elemental distribution changes.

As described above, the FIB milling device of the present embodiment enables flat FIB milling of a sample having the mixture of the first material 201 and the second material 202 at the surface thereof in the processing end.

FIG. 10 also shows the case where the sample 101 includes the first material 201 and the second material 202 only, and the sample 101 may include a third material and other types of materials.

In the above description, the second material 202 exists as a chunk. Instead, the second material 202 may exist at a plurality of positions at the surface of the sample. FIG. 10 shows the case where the first material 201 constitutes the outside of the sample 101 and the second material 202 exists inside the sample 101, and they may have an inverse positional relationship.

[Processing Procedure]

Figure 11:
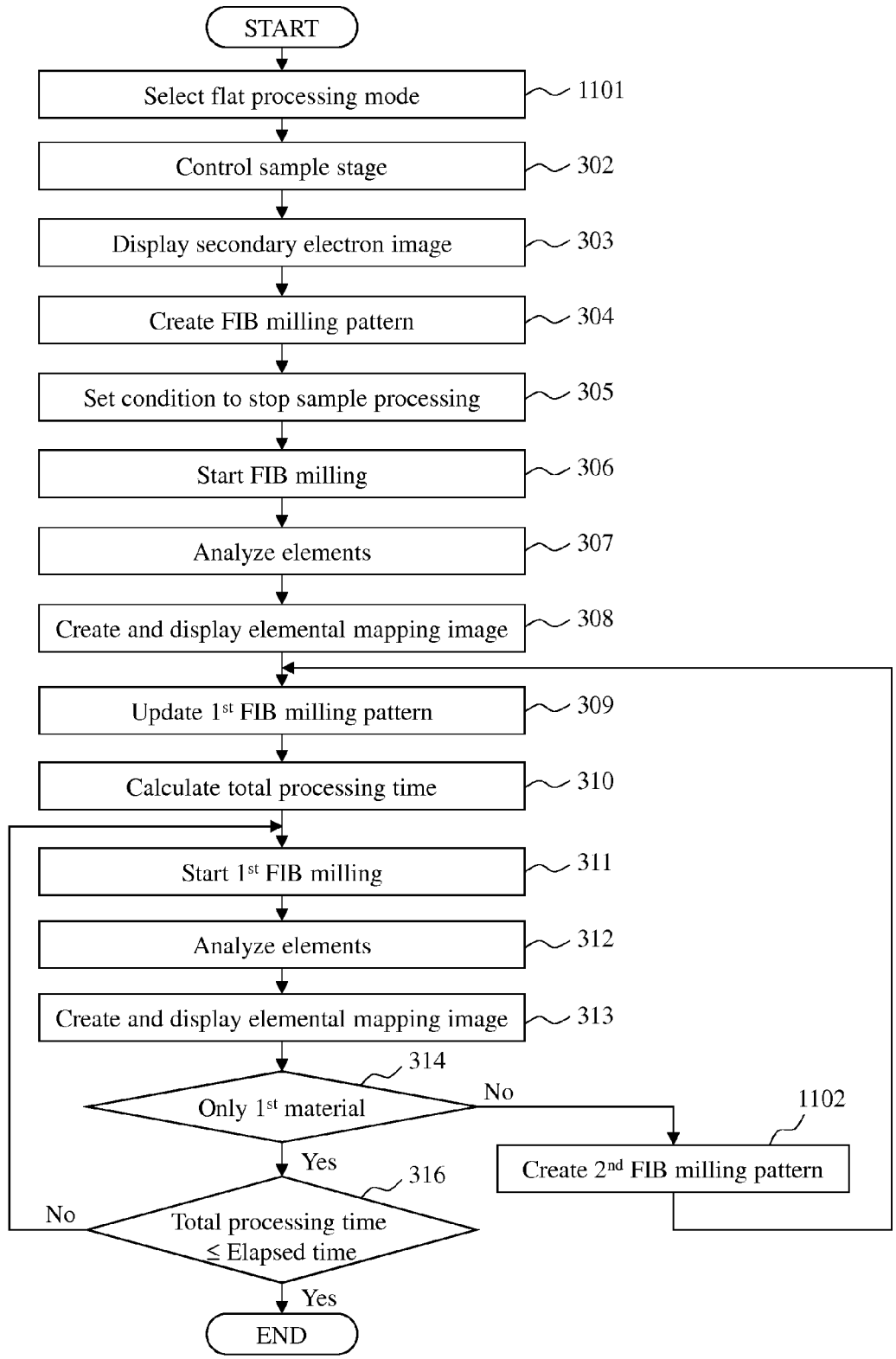
FIG. 11 is a flowchart showing a sample production method according to Embodiment 2.

FIG. 11 shows exemplary processing procedure by the central processor 112 to perform FIB milling of a sample 101 to be a flat surface, the sample 101 being a composite sample whose materials and structure are not specified. The following description also assumes a quadruple-type ion detector as the element detector 110.

Firstly, the operator inputs to the FIB milling device (specifically to the central processor 112) so as to perform FIB milling of the sample 101 in a material-selective manner (Step 1101). For instance, the operator selects a flat processing mode on a selection screen for processing mode.

Subsequent Step 302 to Step 314 are the same processing as those of Embodiment 1, and so the descriptions on the processing at these steps are omitted.

The operation specific to this embodiment is performed when the result at Step 314 is No, i.e., when the sample surface includes a material other than the first material 201 (in the case of FIG. 10, the second material 202). In this case, the FIB milling devices newly creates a second FIB milling pattern showing an area where the second material 202 exists in the secondary electron image (Step 1102). Since the present embodiment is to process the surface of the sample flat, the second material 202 is set automatically as the processing target.

When second conditions associated with the second FIB milling pattern 1001 take over the milling depth of the first conditions associated with the first FIB milling pattern 203, the FIB milling device considers the ratio between the sputtering yield of the second material 202 and the sputtering yield of the first material 201, which is identified based on the elemental analysis, and sets the dwell time of the second conditions reflecting the ratio (Step 1102).

Then, the FIB milling device returns to Step 309 to update the first FIB milling pattern. Specifically, the FIB milling device removes the area of the second material 202 from the first FIB milling pattern 203, thus updating the first FIB milling pattern 203 (Step 309). Then, the FIB milling device calculates the total processing time again.

When the FIB milling device confirms that the total processing time found at Step 310 has passed (the result is Yes at Step 316), the FIB milling device stops the FIB milling.

[Modification Examples of Processing Procedure]

The modification examples for the steps common to Embodiment 1 can be applied to the processing shown in FIG. 11 as well. Herein, FIB milling of the second material 202 based on the second FIB milling pattern 1001 as stated above can start during the FIB milling of the first material 202 based on the first FIB milling pattern 203. That is, during deflection scanning of one frame of the ion beam 105, the two patterns may be switched to perform simultaneous parallel FIB milling of the first material 201 and the second material 202.

Alternatively, after FIB milling of one frame for the first material 201 only ends, FIB milling of one frame for the second material 202 only may be executed before starting of next FIB milling for the first material 201. That is, FIB milling for the first material 201 and FIB milling for the second material 202 may be alternately executed for each frame.

After FIB milling to a predetermined depth for the first material 201 ends, FIB milling to a predetermined depth for the second material 202 may be executed. Such FIB milling can be performed when the first material 201 and the second material 202 are distributed in the same manner in the depth direction of the sample 101.

[GUI]

The present embodiment also can use the display screens of GUIs in FIGS. 4 to 9 as stated above.

[Summary]

As described above, the FIB milling device of the present embodiment enables automatic creation of a FIB milling pattern 203 for each scanning of the ion beam 105 when FIB milling is to be performed for the sample 101 whose material and structure are unknown. This can realize flat milling without influences of the skill or individual differences among operators.

Embodiment 3

The following embodiment describes a FIB milling device to lessen the burden of the operation on the operator compared with Embodiments 1 and 2. A FIB milling device in this embodiment enables selective processing or flat processing of a composite sample 101 with a small amount of jobs, where the material only of the sample 101 is not specified. The FIB milling device according to the present embodiment has the same configuration as that of Embodiment 1, and so the descriptions on the device configuration are omitted.

[Processing Procedure]

Figure 12:
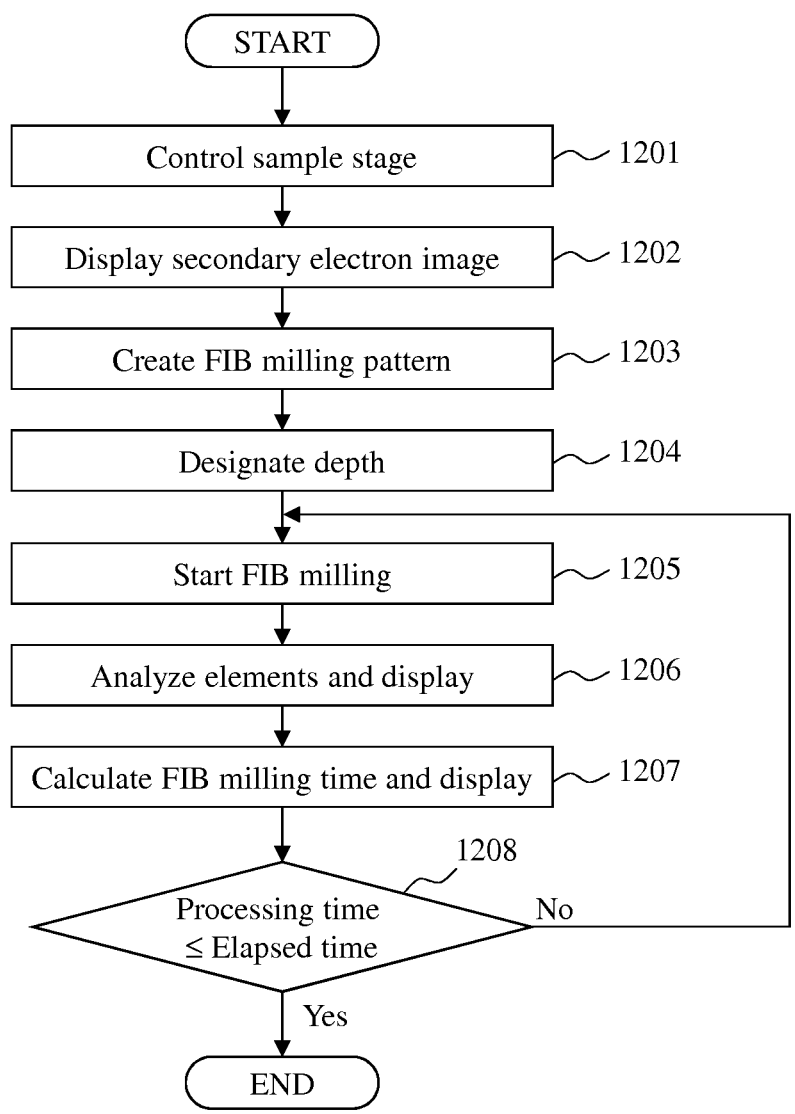
FIG. 12 is a flowchart showing a sample production method according to Embodiment 3.

FIG. 12 shows an exemplary processing procedure by the central processor 112 to perform FIB milling of a composite sample 101 whose materials are not specified. The following description also assumes a quadruple-type ion detector as the element detector 110.

The FIB milling device of the present embodiment is different from the devices in Embodiments 1 and 2 in that conditions given to the FIB milling device is a milling depth only.

Firstly, an operator adjusts the position and the orientation of a sample stage 102 to move the sample 101 to an irradiation range of the ion beam 105 (Step 1201).

Next, the operator observes, on a GUI, a secondary electron image that is an image of secondary electrons emitted from the sample 101 at a position irradiated with the ion beam 105 (Step 1202).

Next, the operator observing the secondary electron image of the sample 101 decides a target position, creates a FIB milling pattern 203 indicating a processing area and overlaps the FIB milling pattern 203 on the target position (Step 1203). As described above, the maximum range of the processing area is given as the FIB milling pattern 203.

Next, the operator instructs, via an input device not illustrated, a "milling depth" as a processing stopping condition to the FIB milling device (Step 1204).

After such setting, the operator instructs the FIB milling device to start the FIB milling (Step 1205).

When starting the processing, the FIB milling device detects an element(s) at the surface of the sample while performing FIB milling, analyzes the element(s) and displays a result of the analysis on a display 113 (Step 1206).

Next, the FIB milling device calculates FIB milling time based on beam current, dwell time, the milling depth and sputtering yield corresponding to the analyzed material that is registered beforehand at a not-illustrated storage area (Step 1207). At this time, the FIB milling device displays the calculated FIB milling time on a GUI for feedback to the operator.

Finally, the FIB milling device continues FIB milling until the calculated processing time has passed (Step 1208). When the set processing time has passed, the FIB milling device ends the FIB milling.

[Summary]

The FIB milling device of the present embodiment eliminates the necessity for the operator to set conditions in details as in Embodiments 1 and 2. This can simplify a program. The present embodiment further eliminates the necessity to create an elemental mapping image. As a result, the overall processing time can be shortened compared with the aforementioned two embodiments.

Embodiment 4

Figure 13:
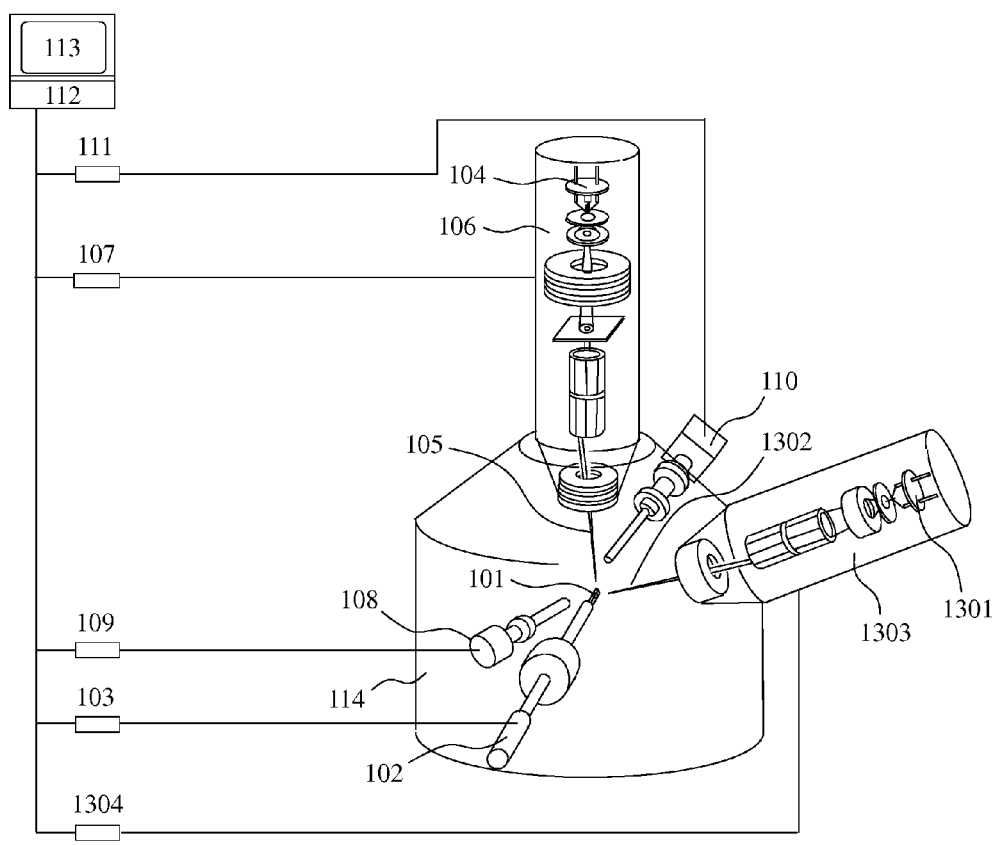
FIG. 13 shows an exemplary configuration of a charged particle beam device according to Embodiment 4.

FIG. 13 shows another exemplary configuration of a charged particle beam device according to the present embodiment. Like reference numerals in FIG. 13 refer to like parts in FIG. 1. The charged particle beam device in FIG. 13 has a composite device configuration including the configuration of the FIB milling device of FIG. 1 as well as a scanning electron microscope (SEM) device.

The SEM device includes an electron source 1301 to generate electrons, an electron beam optical system device 1303 for irradiation of a sample 101 with an electron beam 1302, and an electron beam optical system controller 1304 to control the device 1303. Control data for the electron beam optical system controller 1304 is generated from the calculation by a central processor 112.

This embodiment is different from the above-described embodiments in that the SEM device is used for analysis of elements and an energy dispersive X-ray spectrometer (EDS) to detect an X-ray generated from the sample 101 irradiated with the electron beam 1302 is used as an element detector 110.

In this way, elements are analyzed using the SEM device, which has an advantage of not progressing the processing of the sample 101 during analysis of the element. Since the electron beam 1302 can have a smaller beam diameter than the ion beam 105, another advantage is precise detection of the boundary part between different materials.

The processing procedure according to the present embodiment for material-selective processing or for flat processing of a composite sample 101 whose material and structure are not specified may be substantially the same as the procedure shown in FIG. 3 or FIG. 11.

Differences therebetween are in that the present embodiment requires a step before Step 307 and Step 312 to control a charged particle beam device so that a secondary electron image obtained by the ion beam 105 and a secondary electron image obtained by the electron beam 1302 coincide with each other, and a step after Step 308 and Step 313 to return the sample stage 102 to the original position.

For instance, the former step refers to a control step to change the position of the sample stage 102 from the position where the sample 101 can be irradiated vertically with the ion beam 105 to the position where the sample 101 can be irradiated vertically with the electron beam 1302.

When FIB milling is performed for a sample 101 including a single element whose material is not specified while designating the milling depth, the method similar to the procedure of FIG. 12 can be used.

Other Embodiments

The present invention is not limited to the above-described embodiments, and may include various modification examples. For instance, the entire detailed configuration of the embodiments described above for explanatory convenience is not always necessary for the present invention. A part of one embodiment may be replaced with the configuration of another embodiment, or the configuration of one embodiment may be added to the configuration of another embodiment. The configuration of a part of each embodiment may additionally include another configuration, or a part of the configuration may be deleted or replaced.

The above-described configurations, functions, processing parts, processing means and the like, a part or the entire of them, may be implemented by hardware or by designing as an integrated circuit, for example. Alternatively, the above-described configurations, functions and the like may be implemented by software using a processor that interprets a program to implement these functions and executes the program. Information such as programs, tables and files to implement these functions may be stored on a recording device such as a memory, a hard disk or a SSD (Solid State Drive), or a recording medium such as an IC card, a SD card or a DVD.

Control lines and information lines shown are those required for description, and all of the control line and information lines of a product are not always illustrated. It can be considered that in an actual product, almost all configurations are mutually connected.

REFERENCE SIGNS LIST

101 Sample
102 Sample stage
103 Sample position controller
104 Ion source
105 Ion beam
106 Ion beam optical system device
107 Ion beam optical system controller
108 Secondary electron detector
109 Secondary electron detector controller
110 Element detector
111 Element detector controller
112 Central processor
113 Display
114 Vacuum vessel
201 First material
202 Second material
203 FIB milling pattern
401 Processing mode selection pull-down
402 Processing material selection condition setting pull-down
403 Total processing time
501 Conditions setting screen
502 Management number display part
503 Processing target switching display part
504 Processing area display part
505 Material setting display part
506 Stop condition setting display part
507 Dwell time setting display part
508 Beam condition setting display part
509 Processing time display part 601 Conditions setting list display screen
701 Secondary electron image display part
702 Elemental mapping image display part
703 Elemental distribution display part
801 Boundary part
802 Mouse cursor
803 Threshold
901 Three-dimensional display chart
1001 Second FIB milling pattern
1301 Electron source
1302 Electron beam
1303 Electron beam optical system device
1304 Electron beam optical system controller

The invention claimed is:

1. A charged particle beam device, comprising:
an ion beam optical system device configured to irradiate a sample with an ion beam generated at an ion source;
a first controller configured to control the ion beam optical system device;
an element detector configured to specify elements at an irradiation position on a basis of a signal generated from the sample irradiated with the ion beam;
a second controller configured to control the element detector;
a sample holding mechanism configured to hold the sample;
a vacuum vessel; and
a central processor configured to automatically set conditions for the sample on a basis of information of the elements specified by the element detector.

2. The charged particle beam device according to claim 1, wherein a processing mode is selectable.

3. The charged particle beam device according to claim 2, wherein a processing material selection condition can be set so that detailed conditions can be set in accordance with a processing mode.

4. The charged particle beam device according to claim 1, wherein the conditions include dwell time.

5. The charged particle beam device according to claim 1, wherein when a condition on a material among the conditions is not filled, the condition automatically reflects a result of the element specified.

6. The charged particle beam device according to claim 1, wherein the conditions include processing time.

7. The charged particle beam device according to claim 1, having a function to display conditions corresponding to a plurality of materials on a same screen and in a list form.

8. The charged particle beam device according to claim 1, wherein:
at a predetermined height of the sample, the central processor generates an elemental mapping image based on information of the elements specified by the element detector and identifies constituent elements in the sample and positions of the constituent elements based on the generated elemental mapping image, and
a part of the sample which contains a specific element is selectively processed with the ion beam based on results of the identification.

9. The charged particle beam device according to claim 1, wherein the element detector is one of an ion detector and an energy dispersive X-ray spectrometer.

10. A charged particle beam device, comprising:
an ion beam optical system device configured to irradiate a sample with an ion beam generated at an ion source;
a first controller configured to control the ion beam optical system device;
an element detector configured to specify elements at an irradiation position on a basis of a signal generated from the sample irradiated with the ion beam;
a second controller configured to control the element detector;
a sample holding mechanism configured to hold the sample;
a vacuum vessel; and
a central processor configured to automatically set a processing pattern of the sample on a basis of information of the elements specified by the element detector.

11. The charged particle beam device according to claim 10, wherein the processing pattern is changed in accordance with adjustment of a threshold in a chart showing elemental distribution at the irradiation position.

12. The charged particle beam device according to claim 10, wherein, in the processing pattern of the sample, a shape at a part corresponding to an edge between different types of materials is changed in accordance with a parameter set beforehand.

13. The charged particle beam device according to claim 10, wherein:
at a predetermined height of the sample, the central processor generates an elemental mapping image based on information of the elements specified by the element detector and identifies constituent elements in the sample and positions of the constituent elements based on the generated elemental mapping image, and
a part of the sample which contains a specific element is selectively processed with the ion beam based on results of the identification.

14. The charged particle beam device according to claim 10, wherein the element detector is one of an ion detector and an energy dispersive X-ray spectrometer.

15. A charged particle beam device, comprising:
an ion beam optical system device configured to irradiate a sample with an ion beam generated at an ion source;
a first controller configured to control the ion beam optical system device;
an electron beam optical system device configured to irradiate the sample with an electron beam generated at an electron source;
a second controller configured to control the electron beam optical system device;
an element detector configured to specify elements at an irradiation position on a basis of a signal generated from the sample irradiated with the electron beam;
a third controller configured to control the element detector;
a sample holding mechanism configured to hold the sample;
a vacuum vessel; and
a central processor configured to automatically set conditions for the sample on a basis of information of the elements specified by the element detector.

16. The charged particle beam device according to claim 15, wherein a processing mode is selectable.

17. The charged particle beam device according to claim 15, wherein the conditions include dwell time.

18. The charged particle beam device according to claim 15, wherein when a condition on a material among the conditions is not filled, the condition automatically reflects a result of the element specified.

19. The charged particle beam device according to claim 15, wherein the conditions include processing time.

20. The charged particle beam device according to claim 15, having a function to display conditions corresponding to a plurality of materials on a same screen and in a list form.

21. The charged particle beam device according to claim 15, wherein:
- at a predetermined height of the sample, the central processor generates an elemental mapping image based on information of the elements specified by the element detector and identifies constituent elements in the sample and positions of the constituent elements based on the generated elemental mapping image, and
- a part of the sample which contains a specific element is selectively processed with the ion beam based on results of the identification.

22. The charged particle beam device according to claim 15, wherein the element detector is one of an ion detector and an energy dispersive X-ray spectrometer.

23. A charged particle beam device, comprising:
- an ion beam optical system device configured to irradiate a sample with an ion beam generated at an ion source;
- a first controller configured to control the ion beam optical system device;
- an electron beam optical system device configured to irradiate the sample with an electron beam generated at an electron source;
- a second controller configured to control the electron beam optical system device;
- an element detector configured to specify elements at an irradiation position on a basis of a signal generated from the sample irradiated with the electron beam;
- a third controller configured to control the element detector;
- a sample holding mechanism configured to hold the sample;
- a vacuum vessel; and
- a central processor configured to automatically set a processing pattern of the sample on a basis of information of the elements specified by the element detector.

24. The charged particle beam device according to claim 23, wherein the processing pattern is changed in accordance with adjustment of a threshold in a chart showing elemental distribution at the irradiation position.

25. The charged particle beam device according to claim 23, wherein, in the processing pattern of the sample, a shape at a part corresponding to an edge between different types of materials is changed in accordance with a parameter set beforehand.

26. The charged particle beam device according to claim 23, wherein:
- at a predetermined height of the sample, the central processor generates an elemental mapping image based on information of the elements specified by the element detector and identifies constituent elements in the sample and positions of the constituent elements based on the generated elemental mapping image, and
- a part of the sample which contains a specific element is selectively processed with the ion beam based on results of the identification.

27. The charged particle beam device according to claim 23, wherein the element detector is one of an ion detector and an energy dispersive X-ray spectrometer.

28. A sample production method for providing a sample using a charged particle beam device comprising: an ion beam optical system device configured to irradiate a sample with an ion beam generated at an ion source; a first controller configured to control the ion beam optical system device; an element detector configured to specify elements; a second controller configured to control the element detector; a sample holding mechanism configured to hold the sample; a vacuum vessel; and a central processor, wherein the method comprises:
- automatically setting by the central processor conditions for the sample on a basis of information of an element specified by the element detector to process the sample under the automatically set conditions.

29. A sample production method for providing a sample using a charged particle beam device comprising: an ion beam optical system device configured to irradiate a sample with an ion beam generated at an ion source; a first controller configured to control the ion beam optical system device; an element detector configured to specify elements; a second controller configured to control the element detector; a sample holding mechanism configured to hold the sample; a vacuum vessel; and a central processor, wherein the method comprises:
- automatically setting by the central processor a processing pattern of the sample on a basis of information of an element specified by the element detector to process the sample in accordance with the automatically set processing pattern.

* * * * *